United States Patent [19]
Stein et al.

[11] Patent Number: 5,659,775
[45] Date of Patent: Aug. 19, 1997

[54] TOPOLOGY INDPENDENT SYSTEM FOR STATE ELEMENT CONVERSION

[75] Inventors: Alexander Stein, Boxborough; William Grundmann, Westboro, both of Mass.

[73] Assignee: Digital Equipment Corporation, Maynard, Mass.

[21] Appl. No.: 25,605

[22] Filed: Mar. 3, 1993

[51] Int. Cl.$^6$ ........................................ G06F 9/455
[52] U.S. Cl. ............... 395/800; 364/578; 364/DIG. 1; 364/DIG. 2; 364/489; 395/527; 395/500; 371/22.1
[58] Field of Search .................. 395/250, 200, 395/800, 51, 54, 75, 919, 920, 921, 922, 27, 66, 26, 67, 500, 555, 527; 364/489, 578, 488, 580, 490, 786, 491, DIG. 1, DIG. 2; 371/22.3, 22.5, 22.6, 23, 24, 26, 22.1, 22.2; 340/825.89, 825.87, 825.86

[56] References Cited

U.S. PATENT DOCUMENTS

| | | | |
|---|---|---|---|
| 4,703,435 | 10/1987 | Darringer et al. | 364/489 |
| 4,954,953 | 9/1990 | Bush | 364/578 |
| 5,212,650 | 5/1993 | Hooper et al. | 364/489 |
| 5,243,538 | 9/1993 | Okuzawa et al. | 364/488 |

OTHER PUBLICATIONS

"An Introduction to Computer Logic", H. Troy Nagle, Jr. et al., 1975, N.J., Prentice-Hall Inc., pp.217-242.

"Logic Design Principles", Edward J. McCluskey, Prentice-Hall, 1986, NJ pp. 275-281, 308,309.

Barzilai et al., "SLS-A Fast Switch Level Simulator For Verification and Fault Coverage Analysis", IEEE (1986), Paper 9.2, pp. 164-169.

Bryant, "Extraction of Gate Level Models from Transistor Circuits by Four-Valued Symbolic Analysis", IEEE (1991), pp. 350-353.

Bryant, "Algorithmic Aspects of Symbolic Switch Network Analysis", IEEE Transactions on Computer-Aided Design, vol. CAD-6, No. 4, Jul. 1987, pp. 618-633.

W.V. Quine, "The Problem of Simplifying Truth Functions", Am. Math Monthly, vol. 59, No 8 (Oct. 1952) 521-31.

E.J. McCluskey, "Minimization of Bloolean Functions," Bell System Tech Journal, vol. 35, No. 6 (Nov. 1956) 1417-1444 p2. Jan. 23, 1997.

Primary Examiner—Daniel H. Pan
Attorney, Agent, or Firm—David A. Dagg; Gary E. Ross; Arthur W. Fisher

[57] ABSTRACT

A computer implemented method for determining whether a first (S/R-Latch) description of a state element that is implemented as a set of interconnected electrical devices can be replaced by a second (D-Latch) description of the state element. The method includes the steps of providing a representation of the S/R-Latch description to the computer, causing the computer to apply to the representation a set of rules that define a relationship between the S/R-Latch description and the D-Latch description and that are independent of a topology of the set of interconnected devices, and causing the computer to replace the S/R-Latch description with the D-Latch description of the state element if the representation satisfies the rules.

12 Claims, 7 Drawing Sheets

1) D-Latch --> S/R-Latch
    SET = CLOCK • DATA
    RESET = CLOCK • $\overline{\text{DATA}}$.

2) S/R -Latch --> D-Latch
    SET = CLOCK • DATA + $res_1$
    RESET = CLOCK • $\overline{\text{DATA}}$ + $res_2$ 3) SET and RESET must each include the same set of input variables.

4) SET and RESET can never both be true.

5) CLOCK and DATA must each include at least one input variable.

6) A particular variable cannot appear in both CLOCK and DATA.

FIG. 2

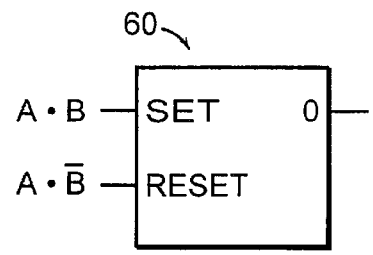
36) SET = A · B
38) RESET = A · $\bar{B}$
40) SET · RESET = (A · B) · (A · $\bar{B}$) = A · (B · $\bar{B}$) = 0
| 42 | A | B | SET | RESET | 52<br>SET · RESET | CLOCK |
|---|---|---|---|---|---|---|
| 44 | 0 | 0 | 0 | 0 | 0 | 0 |
| 46 | 0 | 1 | 0 | 0 | 0 | 0 |
| 48 | 1 | 0 | 0 | 1 | 0 | 1 |
| 50 | 1 | 1 | 1 | 0 | 0 | 1 |
54) CLOCK = A · $\bar{B}$ + A · B
56) CLOCK = A
| 58 | B | SET$_{DATA}$ | RESET$_{DATA}$ | SET$_{DATA}$ | RESET$_{DATA}$ |
|---|---|---|---|---|---|
| 60 | 0 | 0 | 1 | 0 | |
| 62 | 1 | 1 | 0 | 0 | |
64) SET$_{DATA}$ = B
66) RESET$_{DATA}$ = $\bar{B}$
68) DATA = B
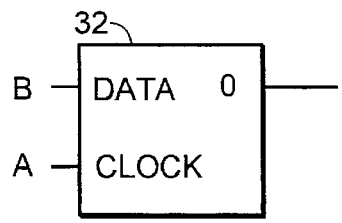
FIG. 3

84) SET = (C+D) · (A · B) = A · B · C + A · B · D

86) RESET = (A · B) · ($\overline{C+D}$) = (A · B) · ($\overline{C}$ · $\overline{D}$) = A · B · $\overline{C}$ · $\overline{D}$

84) SET = A • B • C   A • B • D

86) RESET = A • B • $\bar{C}$ • $\bar{D}$

112) SET • RESET = (A • B • C + A • B • D) • (A • B • $\bar{C}$ • $\bar{D}$)
     = A • B • C • $\bar{C}$ • $\bar{D}$ + A • B • D • $\bar{C}$ • $\bar{D}$
     = 0

| | A | B | C | D | SET | RESET | SET • RESET | CLOCK |
|---|---|---|---|---|---|---|---|---|
| 116 | 0 | 0 | 0 | 0 | 0 | 0 | 0 | 0 |
| 118 | 0 | 0 | 0 | 1 | 0 | 0 | 0 | 0 |
| 120 | 0 | 0 | 1 | 0 | 0 | 0 | 0 | 0 |
| 122 | 0 | 0 | 1 | 1 | 0 | 0 | 0 | 0 |
| 124 | 0 | 1 | 0 | 0 | 0 | 0 | 0 | 0 |
| 126 | 0 | 1 | 0 | 1 | 0 | 0 | 0 | 0 |
| 128 | 0 | 1 | 1 | 0 | 0 | 0 | 0 | 0 |
| 130 | 0 | 1 | 1 | 1 | 0 | 0 | 0 | 0 |
| 132 | 1 | 0 | 0 | 0 | 0 | 0 | 0 | 0 |
| 134 | 1 | 0 | 0 | 1 | 0 | 0 | 0 | 0 |
| 136 | 1 | 0 | 1 | 0 | 0 | 0 | 0 | 0 |
| 138 | 1 | 0 | 1 | 1 | 0 | 0 | 0 | 0 |
| 140 | 1 | 1 | 0 | 0 | 0 | 1 | 0 | 1 |
| 142 | 1 | 1 | 0 | 1 | 1 | 0 | 0 | 1 |
| 144 | 1 | 1 | 1 | 0 | 1 | 0 | 0 | 1 |
| 146 | 1 | 1 | 1 | 1 | 1 | 0 | 0 | 1 |

148) CLOCK = A • B • $\bar{C}$ • $\bar{D}$ + A • B • $\bar{C}$ • D + A • B • C • $\bar{D}$ + A • B • C • D

150) CLOCK = A • B

| | C | D | SET$_{DATA}$ | RESET$_{DATA}$ | SET$_{DATA}$ • RESET$_{DATA}$ |
|---|---|---|---|---|---|
| 154 | 0 | 0 | 0 | 1 | 0 |
| 156 | 0 | 1 | 1 | 0 | 0 |
| 158 | 1 | 0 | 1 | 0 | 0 |
| 160 | 1 | 1 | 1 | 0 | 0 |

162) SET$_{DATA}$ = $\bar{C}$ • D + C • $\bar{D}$ + C • D

164) RESET$_{DATA}$ = $\bar{C}$ • $\bar{D}$

166) DATA = $\bar{C}$ • D + C • $\bar{D}$ + C • D

167) DATA = C + D

FIG. 6

168 → SET = a • b • c + d • i
170 → RESET = h • e • f + d • g

TOPOLOGY INDPENDENT SYSTEM FOR STATE ELEMENT CONVERSION

BACKGROUND OF THE INVENTION

This invention relates to modifying descriptions of state elements for use in verification of VLSI circuit designs, and in particular for replacing SET/RESET latch ("S/R-Latch") descriptions with DATA latch ("D-Latch") descriptions.

Logic abstraction provides a link between the millions of transistors that comprise a digital VLSI circuit and the high level descriptions used to verify that a circuit implementation matches a set of desired specifications. To verify the logical functionality of a VLSI circuit, designers typically perform both simulation of the circuit implementation and verification of the implementation with respect to the specification. Logic abstraction produces a tractable description of an actual circuit and guarantees that the representation correctly depicts the actual circuit.

State elements, which are devices capable of maintaining an output value independent of their input variables, have presented difficulties for logic abstraction processes. Two types of state elements are typically used in digital MOS design, S/R-Latches and D-Latches. Straightforward, automated techniques exist for abstracting S/R-Latches from circuit implementations.

It is often useful to describe state elements as D-Latches. The SET and RESET expressions required for S/R-Latches are typically two or more times as complex as the expressions required for D-Latches. Moreover, circuit designers often explicitly design state elements as D-Latches. An S/R-Latch description of a state element that was explicitly designed as a D-Latch can confuse the designer and thereby make the verification process more difficult to perform.

One technique for identifying D-Latches is to rely on pattern matching to identify device topologies that are known to implement D-Latches.

SUMMARY OF THE INVENTION

The invention provides a straightforward, computer implementable technique for determining, without relying on the topology of the interconnected electrical devices that implement a state element, if a first description of the state element can be replaced by a second description of the state element. A computer determines if it can make such a replacement by applying a set of rules to a representation of the first description of the state element. This set of rules defines a relationship between the first description of the state element and the second description of the state element. If the computer determines that the representation satisfies the rules, it replaces the first description with the second description.

The technique allows a computer to replace a description of an S/R-Latch with a description of a D-Latch when such a replacement is appropriate. In a preferred embodiment, the representation used as the input to the computer specifies the conditions of the input variables that cause the S/R-Latch to be either set or reset. The rules applied by the computer specify the relationship between the set and reset conditions of the S/R-Latch and a data input and a clock input of the D-Latch.

The technique of the invention offers several advantages over pattern matching. Because the technique relies on rules and is not concerned with device topologies, there is no need to create and support new pattern matching procedures for each latch configuration. Thus, the invention is highly useful even in full-custom VLSI design in which new latch configurations are often developed continuously. Pattern matching, on the other hand, is often ill-suited for full-custom VLSI design because new latch configurations represent an ongoing support task of creating new pattern matching procedures as each new design is created. Moreover, because the invention uses rules rather than device topologies, it also determines whether an implementation of a latch actually works, rather than simply assuming that the latch is functional (as is typically done in pattern matching).

Preferred embodiments of the invention include the following features.

The computer accepts a set of descriptions of state elements in a first form and iteratively applies the rules to each description in the set. The first (S/R-Latch) description of each state element is replaced with a second (D-Latch) description if the rules are satisfied, and the S/R-Latch description is maintained if the rules are not satisfied. This allows automated logic abstraction of even entire VLSI microprocessors.

Another feature is the computer's use of a set of rules containing one or more of the following rules.

A first rule is that the set condition of the S/R-Latch must exactly equal the logical AND of the clock input and the data input of the D-Latch, and that the reset condition of the S/R-Latch must exactly equal the logical AND of the clock input and a logical complement of the data input. This rule describes the logical relationship between S/R-Latches and D-Latches.

A second rule used by the computer is that the set condition of the S/R-Latch uses the same group of input variables as the reset condition of the S/R-Latch. This rule ensures that there will be no overlap between the clock and data inputs of the D-Latch, a condition required by the definition of a D-Latch.

A third rule used by the computer is that the set and reset conditions of the S/R-Latch are never both true. If the S/R-Latch does not satisfy this rule, the representation of the S/R-Latch cannot satisfy the first rule because, according to the first rule, the set and reset conditions can never be true simultaneously.

A fourth rule is that the clock input and the data input of the D-Latch must each include at least one of the input variables of the state element. This rule must be met for the data and clock inputs to satisfy the definition of a D-Latch.

Finally, a fifth rule is that any one of the input variables of a D-Latch cannot be included in both the clock input and the data input.

Other features and advantages of the invention will become apparent from the following detailed description, and from the claims.

BRIEF DESCRIPTION OF THE DRAWING

FIG. 2 shows a set of rules that govern conversion between S/R-Latches and D-Latches according to the invention.

FIG. 3 shows the expressions and truth tables for converting an S/R-Latch description to a D-Latch description according to the invention.

FIG. 6 shows the truth tables and expressions for converting the state element of FIG. 4 to a D-Latch according to the invention.

DESCRIPTION OF THE PREFERRED EMBODIMENTS

Introduction

Figure 1:
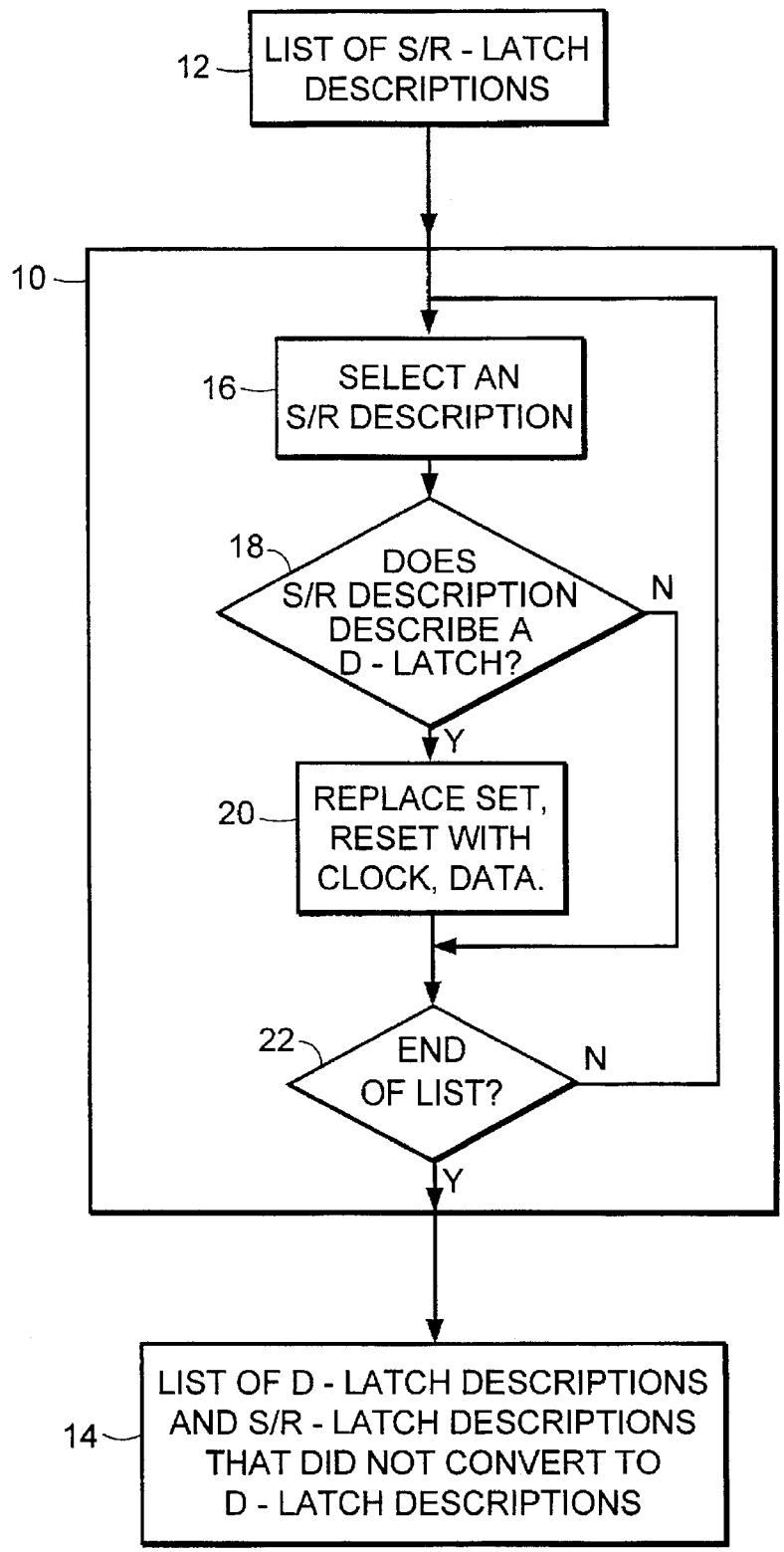
FIG. 1 is a functional block diagram that shows converting a list of SET/RESET latch ("S/R-Latch) descriptions to a modified list of S/R-Latch and DATA latch ("D-Latch") descriptions.

VLSI design produces highly complex state machines. Due to the complexity of these state machines, designers devote significant effort to verifying that their designs actually implement desired specifications. One step in the verification process is proving that the MOS level schematic implementation of a design matches a higher level behavioral specification. This step may be done through a static comparison of the descriptions of the design at the transistor and behavioral levels, or through simulation of these two descriptions. In either case, designers need techniques to model the logical functionality of transistor level designs.

State elements are components of transistor level designs whose functionality has been particularly difficult to model. A state element is an element that can maintain an output value that is independent of its input variables. The two basic types of state elements employed in digital MOS design are the Data latch (D-Latch) and the SET/RESET latch (S/R-Latch).

To ease discussion of the two types of state elements, it is useful to define the terms "TRUE" and "FALSE". A node is "TRUE" when its voltage level is substantially equal to $V_{DD}$, the voltage level of the power supply (e.g., a logic "1"). A node is "FALSE" when its voltage level is substantially equal to VSS, the voltage level of electrical ground, generally defined as 0 volts (e.g, a logic "0"). A node becomes TRUE or FALSE when it is connected through active devices to, respectively, $V_{DD}$ or VSS.

The D-Latch has a CLOCK input and a DATA input. The CLOCK input and DATA input have no overlap. Thus, no input variable appearing in the expression for the CLOCK input can appear in the expression for the DATA input. When the CLOCK input is TRUE, the value of DATA is passed to the output node of the D-Latch. When the CLOCK input is FALSE, the output node of the D-Latch retains the value that it was assigned the last time that CLOCK was TRUE.

The S/R-Latch has one input to "SET" its output node to TRUE and another input to "RESET" its output node to FALSE. When the SET input is TRUE, the output node is TRUE. When the RESET input is TRUE, the output node is FALSE. When neither the SET input nor the RESET input is TRUE, the output node retains the value that is was assigned the last time that either SET or RESET was TRUE. When both the SET input and the RESET input are valid, the value of the output node of an S/R-Latch is undefined. To avoid such a situation, designers typically try to define SET and RESET so that they cannot be valid simultaneously.

Standard techniques exist for automatically deriving S/R-Latch expressions from transistor level designs. For a selected output node, SET is derived in a two step process. First, the devices that connect the output node to $V_{DD}$ through source/drain paths are found. Next, SET is defined as the input values that activate those devices. RESET is derived by finding devices that connect the output node to VSS and determining the input values that activate those devices.

When possible, it is often preferable to describe state elements as D-Latches instead of S/R-Latches. D-Latches are preferable to S/R-Latches for three primary reasons. First, the expressions representing SET and RESET are typically two or more times as complex as those representing DATA and CLOCK. The SET and RESET expressions are typically more complex because they contain a substantial amount of redundant information. Second, circuit designers often design state elements as D-Latches. An S/R-Latch description of a state element that was explicitly designed as a D-Latch can confuse the designer and thereby make the verification process more difficult. Third, an S/R-Latch description of a state element conveys less information than a D-Latch description of the same state element (i.e., a D-Latch description guarantees that the state element has no undefined states, while an S/R-Latch description makes no such guarantee).

Structure and Operation

FIG. 1 illustrates how a processor 10 converts a list 12 of S/R-Latch descriptions to a modified list 14 of S/R-Latch descriptions and D-Latch descriptions. An S/R-Latch description includes a label that designates the S/R-Latch and expressions for SET and RESET. Thus, list 12 typically includes one or more labels, each of which is followed by an expression for SET and an expression for RESET. A D-Latch description includes a label that designates the D-Latch and expressions for DATA and CLOCK. Thus, list 14 typically includes labels that designate one or more D-Latches and/or one or more S/R-Latches, with each label being followed by, as appropriate, expressions for CLOCK and DATA or expressions for SET and RESET.

Processor 10 selects an S/R description (step 16) from list 12 and determines, by a rules-based, topology independent procedure discussed in detail below, if the S/R description describes a D-Latch (step 18). If so, processor 10 replaces the S/R-Latch description in list 12 with a D-Latch description in list 14 (step 20). If not, processor 10 keeps the S/R-Latch description in list 14. Processor 10 repeats steps 16–22 until the end of list 12 is reached (step 22). Upon completion, modified list 14 contains D-Latch descriptions and the S/R-Latch descriptions that were not replaced by D-Latch descriptions.

The rules shown in FIG. 2 govern conversion between S/R-Latch and D-Latch descriptions. All D-Latches convert to S/R-Latches as follows. A D-Latch is "SET" when its CLOCK input and its DATA input are both TRUE. Thus, the SET input of an S/R-Latch that has been converted from a D-Latch is the logical AND of the CLOCK input of the D-Latch and the DATA input of the D-Latch:

SET=CLOCK•DATA (rule 1).

A D-Latch is "RESET" when its CLOCK input is true and its data input is false. Thus, the RESET input of an S/R-Latch that has been converted from a D-Latch is represented by the logical AND of the CLOCK input of the D-Latch and the complement of the DATA input of the D-Latch:

RESET=CLOCK•$\overline{\text{DATA}}$ (rule 1).

Not all S/R-Latches convert to D-Latches. The SET input of an S/R-Latch is the logical OR of a residual term ($res_1$) with the logical AND of the CLOCK input and the DATA input of a D-Latch:

SET=CLOCK•DATA+$res_1$ (rule 2).

The RESET input of an S/R-Latch is the logical OR of a residual term ($res_2$) with the logical AND of the CLOCK input and the complement of the DATA input of a D-Latch:

RESET=CLOCK·$\overline{DATA}$+res$_2$ (rule 2).

An S/R-Latch only converts to a D-Latch when the residual terms (res$_1$ and res$_2$) are zero.

When the S/R-Latch description complies with rules 3–4 and the D-Latch description derived from the S/R-Latch description complies with rules 5–6, the residual terms are zero. Rule 3 requires that SET and RESET each include the same set of input variables. This is necessary because an input variable appearing in only one of the S/R expressions would, by definition, be a residual term. For example, referring to rule 2, an input variable included in SET that is not included in RESET could not be included in CLOCK because CLOCK appears in both SET and RESET. Similarly, that input variable could not be included in DATA because DATA also appears, in complementary forms, in both SET and RESET. Thus, if rule 3 is not satisfied, there must be a non-zero residual and the S/R-Latch description cannot be converted to a D-Latch description.

Rule 4 requires that SET and RESET can never both be TRUE. If SET is TRUE and res$_1$ is zero, CLOCK and DATA are both TRUE. If RESET is TRUE and res$_2$ is zero, CLOCK is TRUE and DATA is FALSE. Thus, when res$_1$ and res$_2$ are zero, SET and RESET cannot both be TRUE because that would require DATA to be simultaneously TRUE and FALSE. Therefore, if SET and RESET are ever both TRUE, then either res$_1$ or res$_2$ must be non-zero.

Rule 5 requires that CLOCK and DATA each include at least one input variable. If CLOCK includes no input variables, this would mean that CLOCK is either always TRUE or always FALSE. If CLOCK were always TRUE, the output node would always equal DATA. If CLOCK were always false, the output node would have no relation to DATA. In either case, the output node would not conform to the definition of a D-Latch. Similarly, if DATA included no input variables, the output node would not conform to the definition of a D-Latch because its value would never change.

Finally, rule 6 requires that a particular input variable cannot appear in both CLOCK and DATA. This is required from the definition of a D-Latch, which says that there can be no overlap between CLOCK and DATA.

Processor 10 applies rules 1–6 to determine if the S/R description describes a D-Latch (step 18 of FIG. 1). In applying these rules, processor 10 assumes that the S/R-Latch description describes a D-Latch until one of the rules is not satisfied. If a rule is not satisfied, processor 10 determines that the S/R-Latch description does not describe a D-Latch and proceeds to step 22 of FIG. 1.

Referring to FIG. 3, processor 10 applies rules 1–6 to convert the description of an S/R-Latch 30 to that of a D-Latch 32 as follows. Given SET and RESET expressions:

SET=A·B                                                        36)

RESET=A·$\overline{B}$,                                        38)

processor 10 first verifies that rule 3 is satisfied. Processor 10 does this by examining the variables included in SET and RESET to determine whether the expressions use the same set of input variables. Here, SET (eq. 36) and RESET (eq. 38) each use input variables A and B, and thereby satisfy rule 3.

Next, processor 10 determines whether SET and RESET satisfy rule 4. Processor 10 performs a logical AND operation on SET (eq. 36) and RESET (eq. 38) to determine if SET and RESET are ever both true. Conceptually, processor 10 can be thought of as generating a truth table 42 of the values of SET (eq. 36) and RESET (eq. 38) that correspond to all possible combinations of input variables A and B. (Cases where expressions or variables are TRUE are denoted by "1" and cases where they are FALSE by "0".) Processor 10 would then generate a column 52 that corresponds to equation 40 for the logical AND of SET (eq. 36) and RESET (eq. 38). This is done by taking the logical AND of the columns for SET (eq. 36) and RESET (eq. 38) in each of rows 44, 46, 48, and 50. Because all entries in column 52 are "0", SET (eq. 36) and RESET (eq. 38) are never both TRUE and therefore satisfy rule 4.

Next, processor 10 generates an expression for CLOCK. From rule 1, CLOCK must be true whenever either SET or RESET is true. Therefore, CLOCK is the logical OR of SET and RESET. In the truth table 42, processor 10 generates a column for CLOCK. In each row, the column for CLOCK is set equal to the logical OR of the values in the columns for SET (eq. 36) and RESET (eq. 38). Thus, CLOCK is "0" in rows 44 and 46 and "1" in rows 48 and 50. Because CLOCK is "1" in rows 48 and 50, the CLOCK expression is:

CLOCK=(A·B)+(A·$\overline{B}$).                                54)

Before testing CLOCK for compliance with rules 5 and 6, processor 10 minimizes CLOCK to eliminate redundant information and to ensure that all input variables appearing in CLOCK are necessary. Processor 10 performs the minimization using the Quine-McCluskey algorithm (described in W. V. Quine, "The Problem of Simplifying Truth Functions," Am. Math Monthly, Vol. 59, No. 8, pp. 521–31 (October 1952); E. J. McCluskey, "Minimization of Boolean Functions," Bell System Tech Journal, Vol. 35, No. 6, pp. 1417–44 (November 1956)), which allows automatic minimization of all boolean logic expressions, regardless of their complexity. In this case, CLOCK (eq. 54) minimizes to:

CLOCK=A.                                                       56)

Processor 10 then checks CLOCK for satisfaction of rules 5 and 6. CLOCK (eq. 56) satisfies rule 5 because it includes at least one input variable (A). CLOCK (eq. 56) satisfies rule 6 because it does not include all input variables. If CLOCK had included all of the input variables, it would not have satisfied rule 6 because DATA would have been unable to satisfy rules 5 and 6. (There would have been no input variables that did not appear in CLOCK (rule 6) left for use by DATA (rule 5)). Note that, prior to minimization, CLOCK (eq. 54) included all of the input variables and therefore would not have satisfied rule 6. This highlights the value of minimizing CLOCK prior to applying rules 5 and 6.

Having generated a valid CLOCK (eq. 56), processor 10 generates a DATA expression. Conceptually, processor 10 first generates a truth table 58 with a column corresponding to the input variables that do not appear in CLOCK. Here, because the input variable A appears in CLOCK (eq. 56), B is the only input variable appearing in SET (eq. 36) or RESET (eq. 38) that is used in truth table 58.

Next, processor 10 generates expressions for SET and RESET that are independent of the variables in CLOCK. These expressions are referred to, respectively, as SET$_{DATA}$ and RESET$_{DATA}$. Processor 10 generates SET$_{DATA}$ by ignoring the input variables that appear in CLOCK and determining if SET is ever TRUE for each combination of the values of the remaining input variables. In this example, processor 10 derives SET$_{DATA}$ by performing a logical OR operation on the value of SET (eq. 36) for each value of B. Thus, conceptually, SET$_{DATA}$ for the "0" entries of variable B in table 42 is the logical OR of SET (eq. 36) in rows 44 and 48 of table 42. This result ("0") is placed in row 60 of table 58. $SET_{DATA}$ for the "1" entries of variable B is the logical OR of SET (eq. 36) in rows 46 and 50. This result ("1") is placed in row 62 of table 58.

$RESET_{DATA}$ is generated in the same manner. That is, processor 10 generates $RESET_{DATA}$ by ignoring the input variables that appear in CLOCK and determining if RESET is ever true for each combination of values for the remaining input variables. In this example, conceptually, $RESET_{DATA}$ for the "0" entries of variable B in table 42 is the logical OR of RESET (eq. 38) in rows 44 and 48 of table 42. This result ("1") is placed in row 60 of table 58. $RESET_{DATA}$ for the "1" entries of variable B is the logical OR of RESET (eq. 38) in rows 46 and 50. This result ("0") is placed in row 62 of table 58.

From truth table 58, $SET_{DATA}$ and $RESET_{DATA}$ are expressed as:

$$SET_{DATA}=B \qquad (64)$$

$$RESET_{DATA}=\bar{B}. \qquad (66)$$

Rule 2 requires that, when $res_1$ and $res_2$ are zero, $SET_{DATA}$ equals DATA and $RESET_{DATA}$ equals $\overline{DATA}$. Therefore, $SET_{DATA}$ and $RESET_{DATA}$ must be complements of each other to satisfy rule 2. Processor 10 verifies this by performing a logical AND operation on $SET_{DATA}$ and $RESET_{DATA}$. (Though the complementary nature of two functions is generally established by performing a logical EXCLUSIVE OR, which is a combination of a logical OR and a logical AND, the logical OR aspect of the EXCLUSIVE OR is guaranteed by the process used to generate $SET_{DATA}$ and $RESET_{DATA}$, and therefore only the logical AND is needed.) In this case, the logical AND of $SET_{DATA}$ (eq. 64) and $RESET_{DATA}$ (eq. 66) is always "0" and the two functions are therefore complements. Because DATA equals $SET_{DATA}$, in this example, DATA is expressed as:

$$DATA=B. \qquad (68)$$

As a final step, processor 10 checks DATA for satisfaction of rule 5. Prior to making this check, the processor 10 minimizes DATA using the Quine-McCluskey method discussed above. In this case, DATA (eq. 68) contains no redundancies and cannot be minimized. Processor 10 need not verify that DATA satisfies rule 6, because this is guaranteed by the process used to generate DATA. Here, DATA (eq. 68) satisfies rule 5 because it includes one input variable (B).

If the equations for CLOCK and DATA satisfy rules 1–6, processor 10 determines (step 18) that the S/R-Latch is the equivalent of a D-Latch. Processor 10 then substitutes (step 20) the CLOCK and DATA expressions for the SET and RESET expressions in list 14. Here, because CLOCK (eq. 56) and DATA (eq. 68) satisfy rules 1–6, S/R-Latch 30 is equivalent to D-Latch 32.

Figure 4:
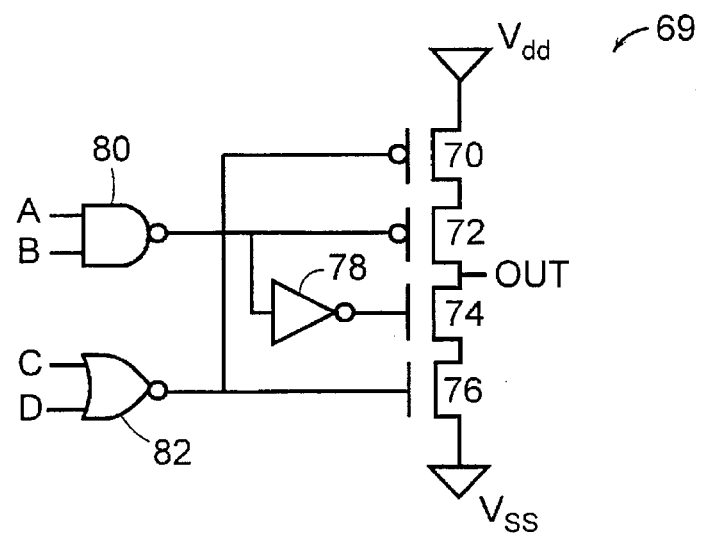
FIG. 4 is a state element and the SET and RESET expressions that describe it.
Figure 5:
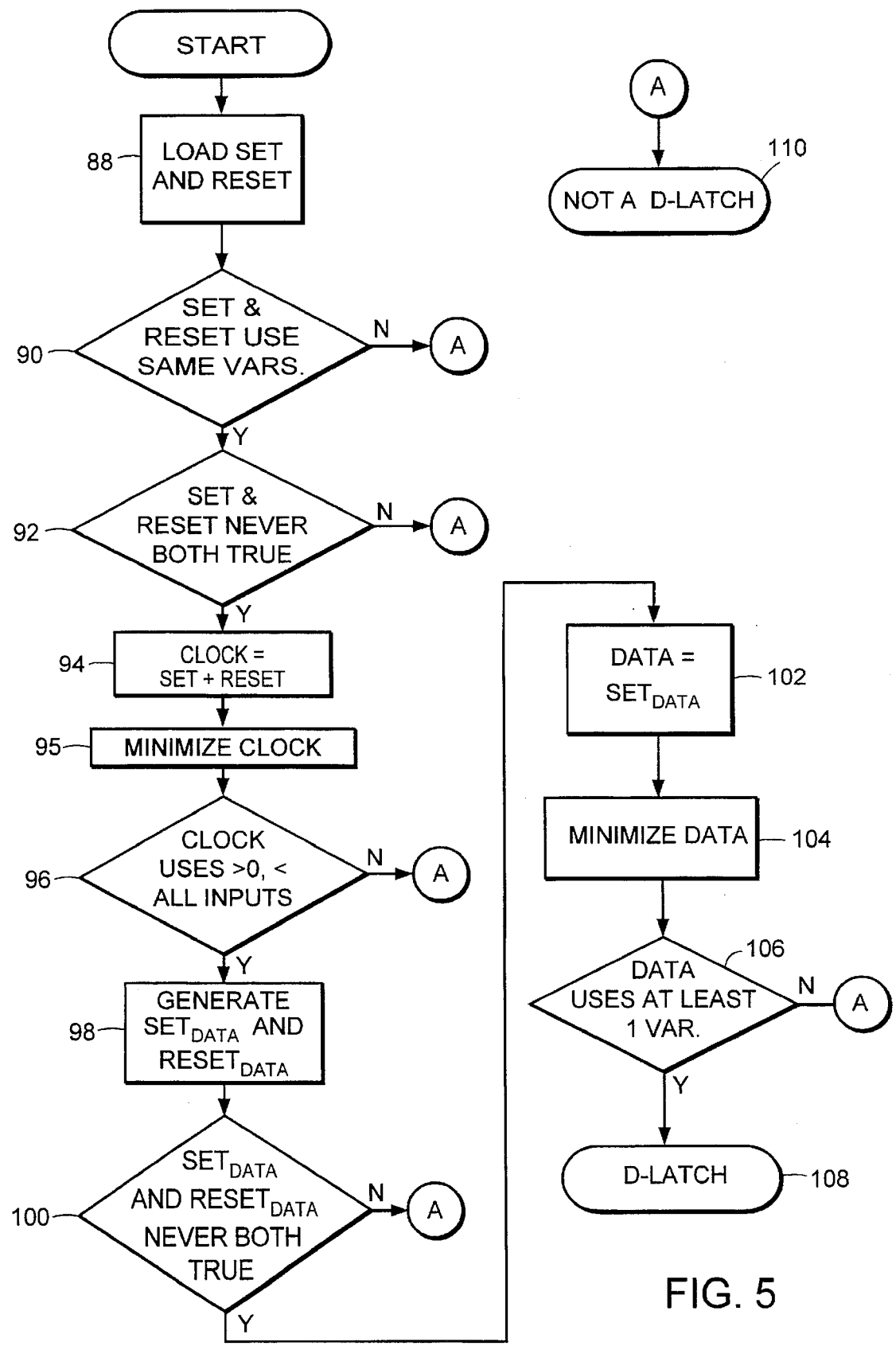
FIG. 5 is a flow chart for generating a D-Latch description from an S/R-Latch description and determining if the D-Latch description is valid according to the invention.

An additional example is described by FIGS. 4–6. As shown in FIG. 4, the SET and RESET expressions for the state element designated by OUT are the input combinations that, respectively, make OUT TRUE by connecting OUT to $V_{DD}$ or make OUT FALSE by connecting OUT to VSS. From an examination of the topology of the circuit in FIG. 4, it is seen that OUT is made TRUE when devices 70 and 72 are active. This occurs when the outputs of NAND gate 80 and NOR gate 82 are both FALSE. Because the output of NAND gate 50 will be FALSE when the logical AND of A and B is TRUE and the output of NOR gate 82 will be FALSE when the logical OR of C and D is TRUE, SET is expressed as:

$$SET=A \cdot B \cdot C + A \cdot B \cdot D. \qquad 84)$$

OUT is made FALSE when devices 74 and 76 are active, which occurs when the outputs of INVERTER 78 and NOR gate 82 are both TRUE. Because the output of INVERTER 78 is TRUE when the output of NAND gate 50 is FALSE, RESET is expressed as:

$$RESET=A \cdot B \cdot \bar{C} \cdot \bar{D}. \qquad 86)$$

Processor 10 converts the S/R-Latch description from FIG. 4 to a D-Latch by the method used in converting the latch described by FIG. 3. FIG. 5 shows the conversion in flow chart form, and FIG. 6 shows the conversion using truth tables similar to those used in FIG. 3.

In step 88, processor 10 loads SET and RESET from list 12. This step is comparable to step 16 of FIG. 1. Next, processor 10 determines if SET and RESET use the same input variables (step 90) by comparing the variables used in each expression. If SET and RESET do not use the same input variables, then SET and RESET do not satisfy rule 3. In that event, as happens any time that one of rules 1–6 is not satisfied, processor 10 determines that the S/R-Latch described by SET and RESET is not a D-Latch and proceeds to step 110. Here, SET (eq. 84) and RESET (eq. 86) each use input variables A, B, C, and D, and therefore satisfy rule 3.

Next, processor 10 determines if SET and RESET are ever both true by performing a logical AND operation on them (step 92). If the AND operation produces a TRUE result, SET and RESET do not satisfy rule 4. Here, as shown by equation 112 and column 115 of truth table 114, SET (eq. 84) and RESET (eq. 86) are never both true and therefore satisfy rule 4.

In step 94, processor 10 generates CLOCK by performing a logical OR on SET and RESET. In this case, the logical OR of SET (eq. 84) and RESET (eq. 86) produces the following expression for CLOCK:

$$CLOCK=A \cdot B \cdot \bar{C} \cdot \bar{D}+A \cdot B \cdot \bar{C} \cdot D+A \cdot B \cdot C \cdot \bar{D}+A \cdot B \cdot C \cdot D \qquad 148)$$

Processor 10 then minimizes CLOCK (step 95) using the Quine-McCluskey method discussed above. This minimization process produces the following expression for CLOCK:

$$CLOCK=A \cdot B. \qquad (150)$$

Processor 10 examines CLOCK to determine whether it uses at least one, and less than all, of the input variables (step 96). If so, CLOCK satisfies rules 5 and 6; if not, CLOCK does not satisfy these rules. Here, CLOCK (eq. 150) uses two (A, B) of the four (A, B, C, D) input variables, and therefore satisfies rules 5 and 6.

Next, processor 10 generates (step 98) $SET_{DATA}$ and $RESET_{DATA}$ by ignoring the variables included in CLOCK. Processor 10 generates $SET_{DATA}$ by determining if SET is ever true for each combination of values for the remaining input variables. In this example, processor 10 derives $SET_{DATA}$ by performing a logical OR operation on the value of SET (eq. 84) for each combination of values of input variables C and D. Conceptually, this operation occurs as follows. $SET_{DATA}$ when C and D are both "0" is the logical OR of SET (eq. 84) in rows 116, 124, 132, and 140 of table 114. This result ("0") is placed in row 154 of table 152. $SET_{DATA}$ when C is "0" and D is "1" is the logical OR of SET (eq. 84) in rows 118, 126, 134, and 142 of table 114 ("1"), and is placed in row 156 of table 152. $SET_{DATA}$ when C is "1" and D is "0" is the logical OR of SET (eq. 84) in rows 120, 128, 136, and 144 of table 114 ("1"), and is placed in row 158 of table 152. Finally, $SET_{DATA}$ when C is "1" and D is "1" is the logical OR of SET (eq. 84) in rows 122, 130, 138, and 146 of table 114 ("1"), and is placed in row 160 of table 152.

RESET$_{DATA}$ is generated in the same manner. That is, processor 10 generates RESET$_{DATA}$ by ignoring the input variables that appear in CLOCK and determining if RESET is ever true for each combination of values for the remaining input variables. In this example, conceptually, RESET$_{DATA}$ when C and D are both "0" is the logical OR of RESET (eq. 86) in rows 116, 124, 132, and 140 of table 114. This result ("1") is placed in row 154 of table 152. RESET$_{DATA}$ when C is "0" and D is "1" is the logical OR of RESET (eq. 86) in rows 118, 126, 134, and 142 of table 114 ("0"), and is placed in row 156 of table 152. RESET$_{DATA}$ when C is "1" and D is "0" is the logical OR of RESET (eq. 86) in rows 120, 128, 136, and 144 of table 114 ("0"), and is placed in row 158 of table 152. Finally, RESET$_{DATA}$ when C is "1" and D is "1" is the logical OR of RESET (eq. 86) in rows 122, 130, 138, and 146 of table 114 ("1"), and is placed in row 160 of table 152.

From truth table 152, SET$_{DATA}$ and RESET$_{DATA}$ are expressed as:

$$\text{SET}_{DATA} = \bar{C} \cdot D + C \cdot \bar{D} + C \cdot D \qquad 162)$$

$$\text{RESET}_{DATA} = \bar{C} \cdot \bar{D}. \qquad 164)$$

Processor 10 verifies that SET$_{DATA}$ and RESET$_{DATA}$ are never both true by performing a logical AND operation on SET$_{DATA}$ and RESET$_{DATA}$ (step 100). In this case, the logical AND of SET$_{DATA}$ (eq. 162) and RESET$_{DATA}$ (eq. 164) is always "0" and the two functions are therefore complements. Because DATA equals SET$_{DATA}$, DATA is expressed as:

$$\text{DATA} = \bar{C} \cdot D + C \cdot \bar{D} + C \cdot D \text{ (step 102).} \qquad 166)$$

Before checking DATA for satisfaction of rule 5 (step 106), processor 10 minimizes DATA using the Quine-McCluskey method discussed above (step 104). In this case, DATA (eq. 166) contains no redundant variables, but can be minimized as:

$$\text{DATA} = C + D. \qquad 167)$$

DATA (eq. 167) satisfies rule 5 because it includes two input variables (C and D).

At this point, because the equations for CLOCK and DATA satisfy rules 1–6, the processor 10 determines (step 108) that the SR-Latch described by SET and RESET is a D-Latch. Processor 10 then substitutes (step 20 of FIG. 1) CLOCK and DATA for SET and RESET in list 14. Thus, in this case, CLOCK (eq. 150) and DATA (eq. 167) are substituted for SET (eq. 84) and RESET (eq. 86).

Figure 7:
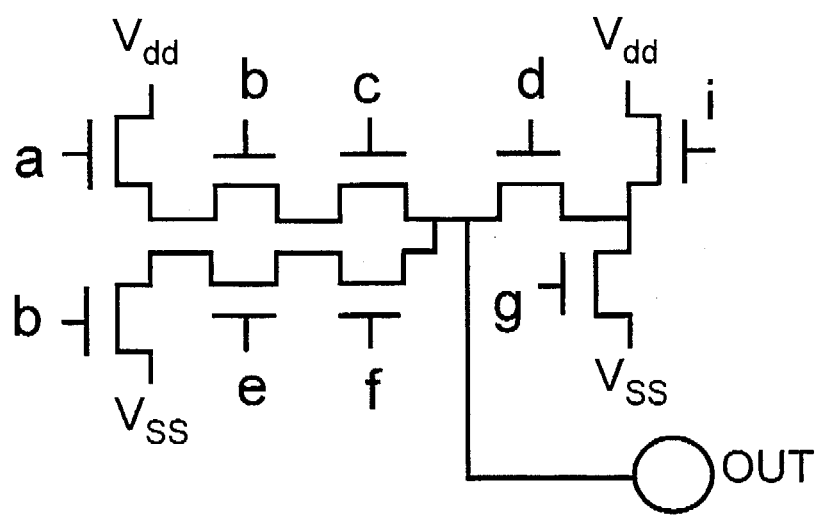
FIG. 7 is a state element and the SET and RESET expressions that describe it.

As shown in FIG. 7, not all S/R-Latch descriptions represent D-Latches. SET (eq. 168) and RESET (eq. 170) for node OUT of S/R-Latch 172 express the input combinations that, respectively, force OUT to TRUE or FALSE. OUT is forced to TRUE when the logical AND of a, b, and c or the logical AND of d and i is TRUE. OUT is forced to FALSE when the logical AND of h, e, and f or the logical AND of d and g is TRUE.

In step 88, processor 10 loads the expressions for SET (eq. 168) and RESET (eq. 170). The processor 10 then proceeds to step 90, where it would determine that SET (eq. 168) and RESET (eq. 170) do not satisfy rule 3 because they do not use the same input variables. Because SET (eq. 168) and RESET (eq. 170) do not satisfy rule 3, S/R-Latch 172 is not a D-Latch, and processor 10 proceeds to step 110.

The appended source code appendix embodies the rules-based, topology independent procedure for determining whether a description of an S/R-Latch can be replaced with a description of a D-Latch and making such a replacement when appropriate as described and claimed in this application, and is incorporated herein by reference. It may be implemented on any computer (such as a Digital Equipment Corporation VAX-based computer, an Intel DOS-based computer, etc.) that supports a structured programming language.

Other embodiments are within the scope of the following claims. For example, instead of converting S/R-Latch descriptions to D-Latch descriptions, processor 10 could convert S/R-Latch descriptions to SET priority latch (SSR-Latch) descriptions. A SSR-Latch is similar to a S/R-Latch with the exception that, when SET and RESET are both TRUE, the output of a S/R-Latch is undefined and the output of a SSR-Latch is TRUE. Alternatively, processor 10 could convert SSR-Latch descriptions to D-Latch descriptions.

A portion of the disclosure of this patent document contains material which is subject to copyright protection. The copyright owner has no objection to the facsimile reproduction by anyone of the patent document or patent disclosure, as it appears in the Patent and Trademark Office file or records, but otherwise reserves all copyright rights whatsoever.

SOURCE CODE APPENDIX

FOR

UNITED STATES LETTERS PATENT

TITLE:     STATE ELEMENT CONVERSION

APPLICANT:     ALEXANDER STEIN
                   WILLIAM GRUNDMANN

"Express Mail" mailing label number _RB889292063US_

Date of Deposit _March 3, 1993_

I hereby certify under 37 CFR 1.10 that this correspondence is being deposited with the United States Postal Service as "Express Mail Post Office to Addressee" with sufficient postage on the date indicated above and is addressed to the Commissioner of Patents and Trademarks, Washington, D.C. 20231.

latch.c        Mon Feb 8 13:58   1993           Page 1, Line 1

```c
#include <global_incs.h>
#include <global_defs.h>
#include <global_ext.h>
#include <latch.h>
#include <util.h>
#include <domain.h>
#include <reduce.h>
#include <rs.h>
#include <timing.h>
#include <analysis.h>

/************** external variables taken from to rs.c *******************************************/
extern int max_number;
extern int care_term;
extern int dont_care_term;
extern int num_nodes;
extern NODE_REC_P in_node[MAX_IN_NODES];
extern struct twobits L_array[MAX_STATES];

/****************************************************************************************
 * Routine: void Check_For_Latch (NODE_REC_P np)
 * Written by: Alexander D. Stein
 * Function: This function looks for D-Latchs in SR equations. It is called for each node which has
 * state and which passes the following sanity checks:
 *          1) SUP(Set) == SUP(Reset)
 *          2) Set * Reset == 0
 */
void Check_For_Latch (NODE_REC_P np)
{
   DRIVER_P drv_p1;                    /* temp driver used to store top level latch */
   ENTRY_P data_list = NULL;           /* non reduced equation for data list */
   ENTRY_P clk_list = NULL;            /* non reduced equation for clock list */
   ENTRY_P output_list;                /* reduced min terms used for data and clock */
   BIT clock[MAX_STATES];              /* truth table for the clock */
   BIT data[MAX_STATES];               /* truth table for the data */
   int care_bits;                      /* each TRUE bit represents a variable used in the function */
   int clk_cnt;                        /* Number of nodes in clock expression */
   int data_cnt;                       /* Number of nodes in data expression */
   int state;                          /* variable to denote the state of the input nodes */

/* First create the CLOCK function as CLOCK = S+R. Note that L_array represents
      the truth table for the Set and Reset terms.
    */
   for ( state = 0; state < max_number; state++ )
     clock[state] = L_array[state].pd | L_array[state].pu;

/* Next the Clock function must be minimized to remove dependance on
      redundant variables. This will be done through the use of the
      Quine-McCluskey minimization algorithm; implemented in Reduce_Logic().
    */
   PrepForReduction(clock, &clk_list);         /* setup for clk_list */
   Reduce_Logic(clk_list, &output_list, num_nodes, &care_term, &dont_care_term);

/* Now determine the bits needed in the clock expression, this is done by
    * decoding the output list for care bits. The result is then unary encoded in
    * care_bits; a 1 implies the variable is used in the Clock function.
    */
   care_bits = GetSupport(output_list, &clk_cnt);
   Free_Common_List( (COMMON_BLOCK_P *) &clk_list, ENTRY);

/* Now perform the first clock sanity check; i.e. the clock function must use
    * a non-zero subset of available inputs without using all inputs. clk_cnt
    * is the number of variables used in the Clock function.
    */
   if ( (clk_cnt == 0) OR (clk_cnt == num_nodes) )
       {                                         /* failed sanity check, this is not a D-Latch */
        Free_Common_List( (COMMON_BLOCK_P *) &output_list, ENTRY);
        return;
       }
``` latch.c        Mon Feb 8 13:58   1993         Page 2, Line 70

```c
/* So far the Clock function looks good, so create a new driver, drv_p1,
 * to hold the equation.
 */
drv_p1 = Insert_Driver(NULL, EXP_LATCH);
Make_Equation(np, &drv_p1->sub_expression.d, output_list, care_term, dont_care_term);
Free_Common_List( (COMMON_BLOCK_P *) &output_list, ENTRY);

/* This next section creates the data array by removing clock dependance from L_array.
 * The technique used is like a boolean division of the Set and Reset terms by the Clock
 * function. This is done by setting the clock function to TRUE and creating a reduced truth
 * table for data. In practice this means ORing all rows of the original truth table which
 * differ only in the state of the variables used in the clock function.
 */
BooleanDivide(care_bits, data);

/* Next we do sanity checks on the Data function. In order for this to really be a latch the
 * following must be true:
 *   1 - The reduced SET and RESET terms must still be exclusive; i.e.
 *       Sclk * Rclk = 0, and Sclk + Rclk = 1. The second check is already guaranteed to be true
 *       since the SUP(CLOCK) < SUP(Set).
 *
 *   2 - The data must use a proper subset of the input variables
 */ for (state = 0; state < max_number; state++ )
  if (L_array[state].pu AND L_array[state].pd)
    {
      Delete_Equation(&drv_p1, np);         /* no common data term so keep SR */
      return;                               /* conflict so this is not a latch */
    }

/* Next the Data function must be minimized to remove dependence on
    redundant variables. This will be done through the use of the
    Quine-McCluskey minimization algorithm; implemented in Reduce_Logic().
 */
PrepForReduction(data, &data_list);         /* setup for data_list */
Reduce_Logic(data_list, &output_list, num_nodes, &care_term, &dont_care_term);

/* Now determine the bits needed in the data expression, this is done by
 * decoding the output list for care bits. The result is then unary encoded in
 * care_bits; a 1 implies the variable is used in the data function.
 */
care_bits = GetSupport(output_list, &data_cnt);

/* Now perform the data sanity check; i.e. the data function must use a non-zero subset of
 * inputs; data_cnt is the number of variables used in the data function.
 */
if ( data_cnt == 0 )
  {                                          /* failed sanity check, this is not a D-Latch */
    Free_Common_List( (COMMON_BLOCK_P *) &data_list, ENTRY);
    Free_Common_List( (COMMON_BLOCK_P *) &output_list, ENTRY);
    return;
  }

/* Since we made it to here, this is definitely a latch */
/* The last thing to make the data equation */
Make_Equation(np, &drv_p1->sub_expression.d->next, output_list, care_term, dont_care_term);

Delete_Equation(&np->equation, np);         /* remove old SR equation */ np->equation = drv_p1;                      /* assign LATCH to node np */

Free_Common_List( (COMMON_BLOCK_P *) &data_list, ENTRY);
Free_Common_List( (COMMON_BLOCK_P *) &output_list, ENTRY);

}
``` latch.c     Mon Feb 8 13:58 1993     Page 3, Line 137

```c
/*******************************************************************************
 * Routine: void PrepForReduction(BIT q[], ENTRY_P *list)
 * Written by: Alexander D. Stein
 * Parameters: q is the truth table for list
 *             list is a pointer to the non-reduced equation
 * Called by: Check_For_Latch()
 * Return: void
 * Function: This function creates non-minimized entry lists for use by the
 * Quine-McCluskey reduction routines in Reduce_Logic().
 */ void PrepForReduction(BIT q[], ENTRY_P *list)
{
    ENTRY_P ety_p1;                         /* walking pointer for entry lists */
    int state;                              /* variable to denote the state of the input nodes */
    int bit_count;                          /* number of bits in a minterm */
    BIT mask;                               /* walking 1 to mask bits in the state */
    int cnt;                                /* simple counter */ for ( state = 0; state < max_number; state++ )
                                            /* create min term list for q */
        {
            care_term = CLEAR_BITS;
            bit_count = 0;
            if ( q[state] )
                {
                    for ( mask = 1, cnt = 0; cnt < num_nodes; cnt++, mask = mask << 1 )
                        {
                            if ( mask & state )
                                {
                                    care_term |= mask;
                                    bit_count++;
                                }
                        } ety_p1 = (ENTRY_P) Allocate_Common(ENTRY);
                    ety_p1->next = *list;
                    *list = ety_p1;
                    ety_p1->care = care_term;
                    ety_p1->dont_care = CLEAR_BITS;
                    ety_p1->care_output = TRUE;
                    ety_p1->hit = FALSE;
                    ety_p1->need = FALSE;
                    ety_p1->dd.bits_set = bit_count;
                }
        }
}
```

*latch.c*    *Mon Feb 8 13:58 1993*    *Page 4, Line 184*

```c
/***************************************************************************
 * Routine: void BooleanDivide(int care_bits)
 * Written by: Alexander D. Stein
 * Globals: L_array, max_number and num_nodes.
 * Called by: Check_For_Latch()
 * Return: void
 * Function: This function creates a reduced truth table, removing all dependency on the bits used
 * in clk_care_bits.
 */
void BooleanDivide(int care_bits, BIT q[])
{
    BIT mask;                          /* walking 1 to mask bits in the state */
    int cnt;                           /* simple counter */
    int ix;                            /* another counter */
    int state;                         /* variable to denote the state of the input nodes */
    BIT done;                          /* flag used to end collapsing of one row in new */
                                       /* table */
    int inc;

for (cnt = 0, ix = max_number - 1, mask = 1; cnt < num_nodes; cnt++, mask = mask << 1)
        {                              /* remove care_bits dependance from L_array */
            if ( (mask & care_bits) )
                {                      /* this bit should be removed */
                    inc = 2 * mask;
                    for (state = 0, done = FALSE; !done; state = (state + inc) % ix)
                        {
                            L_array[state].pu |= L_array[state+mask].pu;
                            L_array[state+mask].pu = L_array[state].pu;

L_array[state].pd |= L_array[state+mask].pd;
                            L_array[state+mask].pd = L_array[state].pd;

q[state] = q[state+mask] = L_array[state].pu;

if (state + mask >= ix)
                                done = TRUE;
                        }
                }
        }
}
``` latch.c        Mon Feb 8 13:5&   1993        Page 5, Line 225

```c
/***********************************************************************************
 * Routine: int GetSupport(ENTRY_P output_list, int *in_cnt)
 * Written by: Alexander D. Stein
 * Called by: Check_For_Latch()
 * Return: a unary encoded int recording inputs which are used in the entry list.
 * Function: This function gets the Support (i.e. the input nodes used in the output_list).
 */
int GetSupport(ENTRY_P output_list, int *in_cnt)
{
    ENTRY_P ety_p1;                            /* reduced min terms */
    int care_bits;
    int cnt;
    int mask;

care_bits = ~dont_care_term;          /* first get the common terms (which are negated) */
    for ( ety_p1 = output_list; ety_p1 != NULL; ety_p1 = ety_p1->next )
        {                                  /* now add the non-common term dont cares */
            for ( mask = 1, cnt = 0; cnt < num_nodes; cnt++, mask = mask << 1 )
            {
                if ( mask & ~ety_p1->dont_care )
                    care_bits |= mask;
            }
        } for (*in_cnt = 0, mask = 1, cnt = 0; cnt < num_nodes; cnt++, mask = mask << 1)
        if (mask & care_bits)
            *in_cnt += 1;

return(care_bits);
}
```

What is claimed is:

1. A computer implemented method for determining if a first description of a state element that is implemented as a set of interconnected electrical devices is replaceable by a second description of said state element, wherein said first description is a S/R-Latch and said second description is a D-Latch, wherein said state element has one or more input variables, comprising:

provide a representation of said first description, said representation specifying a condition of said input variables in which said S/R-Latch is set and a condition of said input variables in which said S/R-Latch is reset;

applying a set of rules to said representation, wherein said set of rules define a relationship between said first description and said second description, wherein said set of rules are independent of a topology of said set of interconnected devices, wherein said rules specify relationships between said set condition and said reset condition of said S/R-Latch and a data input and a clock input of said D-Latch, and wherein said rules include that:

(a) said set condition exactly equals the logical AND of said clock input and said data input, and (b) said reset condition exactly equals a logical AND of said clock input and a logical complement of said data input; and replacing said first description with said second description of said state element if said representation satisfies said rules.

2. The method of claim 1 wherein said set condition includes a first group of said input variables and said reset condition includes a second group of said input variables, and wherein one of said rules is that said first group of said input variables must be the same as said second group of said input variables.

3. The method of claim 1 wherein said rules include that said set condition and said reset condition are never both true.

4. The method of claim 1 wherein said rules include that said clock input and said data input must each include at least one of said input variables of said state element.

5. The method of claim 1 wherein said rules include that a said input variable of said state element cannot be included in both said clock input and said data input.

6. The method of claim 1 further comprising maintaining said first description of said state element if said representation does not satisfy said rules.

7. The method of claim 1 further comprising:

providing a set of representations, each one of said set of representations corresponding to a first description of a state element in a circuit; and applying said rules to each one of said representations to alternatively replace said first description with a second description of said state element if said representation satisfies said rules or maintain said first description of said state element if said representation does not satisfy said rules.

8. The method of claim 7 wherein said rules further include that:

(c) said set condition must include a first group of said input variables and said reset condition must include a second group of said input variables, and wherein one of said rules is that said first group of said input variables must be the same as said second group of said input variables, (d) said set condition and said reset condition may never both be true, (e) said clock input and said data input must each include at least one of said input variables of said state element, and (f) a said input variable of said state element cannot be included in both said clock input and said data input.

9. The method of claim 8 further comprising:

providing a set of representations, each one of said representations corresponding to a first description of a state element in a circuit, and applying said rules to each one of said representations and alternatively replacing said first description with a second description of said state element if said representation satisfies said rules, or maintaining said first description of said state element if said representation does not satisfy said rules.

10. A computer implemented method for determining if an S/R-Latch description of a state element that is implemented as a set of interconnected electrical devices is replaceable by a D-Latch description of said state element, wherein said state element has one or more input variables, comprising:

providing a representation of said S/R-Latch, said representation specifying a condition of said input variables in which said S/R-Latch is set and a condition of said input variables in which said S/R-Latch is reset;

applying a set of rules to said representation, wherein said set of rules define a relationship between said S/R-Latch and said D-Latch, wherein said rules are independent of a topology of said set of interconnected devices, wherein said rules specify relationships between said set condition and said reset condition of said S/R-Latch and a data input and a clock input of said D-Latch, and wherein said rules include that:

(a) said set condition exactly equals the logical AND of said clock input and said data input, and (b) said reset condition exactly equals a logical AND of said clock input and a logical complement of said data input; and replacing said S/R-Latch description with said D-Latch description of said state element if said representation satisfies said rules.

11. The method of claim 10 further comprising maintaining said S/R-Latch description of said state element if said representation does not satisfy all of said rules.

12. A computer system for determining if a first description of a state element that is implemented as a set of interconnected electrical devices can be replaced by a second description of said state element, wherein said first description is a S/R-Latch and said second description is a D-Latch, wherein said state element has one or more input variables, comprising:

means for providing to said computer a representation of said first description to said computer, said representation specifying a condition of said input variables in which said S/R-Latch is set and a condition of said input variables in which said S/R-Latch is reset;

said computer including means for applying to said representation a set of rules that define a relationship between said first description and said second description and that are independent of a topology of said set of interconnected devices, wherein said rules specify relationships between said set condition and said reset condition of said S/R-Latch and a data input and a clock input of said D-Latch, wherein said rules include that:

(a) said set condition exactly equals the logical AND of said clock input and said data input, and (b) said reset condition exactly equals a logical AND of said clock input and a logical complement of said data input; and said computer including means for replacing said first description with said second description of said state element if said representation satisfies and rules.

* * * * *